(12) United States Patent
Komatsu

(10) Patent No.: US 6,265,906 B1
(45) Date of Patent: Jul. 24, 2001

(54) SENSE AMPLIFIER CIRCUIT

(75) Inventor: Koji Komatsu, Nara (JP)

(73) Assignee: Sharp Kabushiki Kaisha (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,754

(22) Filed: Oct. 14, 1998

(30) Foreign Application Priority Data

Dec. 24, 1997 (JP) .................................................. 9-354706

(51) Int. Cl.[7] .................................................. G01R 19/00
(52) U.S. Cl. .............................. 327/53; 327/56; 327/66
(58) Field of Search .................................. 327/50, 51, 52, 327/53, 56, 63, 65, 66, 68, 69, 71, 72, 74, 75, 77, 80, 82, 90, 97; 365/188.07–188.09

(56) References Cited

U.S. PATENT DOCUMENTS

| | | | |
|---|---|---|---|
| 5,049,761 | * | 9/1991 | Zitta .................................... 327/172 |
| 5,525,919 | * | 6/1996 | Phelan .................................. 327/52 |
| 5,570,047 | * | 10/1996 | Makino et al. ....................... 327/80 |
| 5,608,676 | * | 3/1997 | Medlock et al. ................ 365/189.09 |
| 5,703,503 | * | 12/1997 | Miyamoto et al. .................... 327/58 |
| 6,154,065 | * | 11/2000 | Komatsu ................................ 327/56 |

FOREIGN PATENT DOCUMENTS 5-217385A  8/1993 (JP) .

* cited by examiner

Primary Examiner—Kenneth B. Wells
Assistant Examiner—Hai L. Nguyen
(74) Attorney, Agent, or Firm—Morrison & Foerster LLP

(57) ABSTRACT

A sense-amplifier circuit for a multivalued information storing memory is featured by a reduced current consumption realized without any elongation of delay time, which circuit comprises plural current-mirror sub-sense-amplifiers corresponding to plural reference potentials VREF, wherein those having higher reference potentials among the sub-sense-amplifiers are provided each with a current-limiting switching element QNX.

6 Claims, 16 Drawing Sheets

| VBIT | SA1 | SA2 | SA3 | D1 | D2 |
|------|-----|-----|-----|----|----|
| VTH1 | 1 | 1 | 1 | 0 | 0 |
| VTH2 | 0 | 1 | 1 | 0 | 1 |
| VTH3 | 0 | 0 | 1 | 1 | 0 |
| VTH4 | 0 | 0 | 0 | 1 | 1 |

SENSE AMPLIFIER CIRCUIT

BACKGROUND OF THE INVENTION

The present invention relates to current-mirror-type sense-amplifier circuits that can be effectively applied in a multivalued-information memory for storing three or more values in each of its memory cells.

There has been proposed a multivalued-information memory capable of storing three or more values in each of its memory cells. This is realized in such a manner that plural threshold potential values are preset for each memory cell by changing an amount of impurities induced into channel areas of the memory cell for a mask ROM or by changing an amount of stored charge of floating gates for a flash $E^2$PROM. The discrimination of these threshold potentials is conducted by comparing each potential at each bit line with plural reference values corresponding to the threshold potential values of the memory cell.

In case of storing, e.g., four-value information in each memory cell with bit-line potentials corresponding to respective threshold potential values expressed as VTH1, VTH2, VTH3 and VTH4, the first reference potential value VREF1 is set to a certain value between the values VTH1 and VTH2, the second reference potential value VREF2 is set to a certain value between the values VTH2 and VTH3 and the third reference potential value VREF3 is set to a certain value between the values VTH3 and VTH4. The above reference values are used by sub sense-amplifiers SL1, SL2 and SL3 as shown in FIG. 1. A bit-line potential VBIT is one of the values VTH1, VTH2, VTH3 and VTH4 and, therefore, output signals SA1, SA2 and SA3 corresponding to the bit-line potentials are obtained. FIG. 2 shows a relationship between bit-line potentials and reference potentials. CE is a signal for activating a sense amplifier. Two-bit information (D1, D2 in FIG. 4) according to the above-described output signals SA1, SA2 and SA3 can be readout by a circuit of FIG. 3.

Japanese Laid-open Patent Publication No. 5-217385 discloses a sense amplifier circuit used for a mask ROM. In the disclosure, as shown in FIG. 5, the sense amplifier is applied for a mask ROM for storing four-valued information in each of memory cells, wherein four bit-line potentials VTH1, VTH2, VTH3 and VTH4 are used as reference potentials corresponding to respective thresholds of the memory cell. The amplifier circuit is provided with three sub sense-amplifiers SL1, SL2 and SL3, each of which comprises a current mirror circuit. The first sub sense-amplifier SL1 is given the first and second bit-line potentials VTH1 and VTH2 as reference potentials, the second sub sense-amplifier SL2 is given the second and third bit-line potentials VTH2 and VTH3 as reference potentials and the third sub sense-amplifier SL3 is given the third and fourth bit-line potentials VTH3 and VTH4. This enables the amplifier circuit to use reference bit-lines having the same construction as that of the corresponding bit-lines of the memory cell, thus realizing stable reading of the potentials.

Referring now to FIGS. 6 and 7, a current-mirror-type sense-amplifier will be described as bellow:

As seen in FIG. 6, the first static inverter is composed of a n-type metal-oxide silicon field-effect transistor MOSFET QN1 and a p-type MOSFET QP1 and the second static inverter is composed of a n-type MOSFET QN2 and a p-type MOSFET QP2: both the converters are in parallel to each other and connected each at one end to the ground potential (GND) through a n-type MOSFET QN3. The static converters are also connected each at the other end to the power-source potential (Vcc). With the signal CE for activating the sense-amplifier, the n-type MOSFET QN3 conducts bringing the sense-amplifier into the state being ready to work. The p-type MOSFET QP1 and QP2 compose a load side of the current mirror. The n-type MOSFET QN1 and QN2 are supplied with input potentials to be compared with each other. Namely, a reference potential VREF is input to a gate of the n-type MOSFET QN1 and a bit-line potential VBIT is fed to a gate of the n-type MOSFET QN2. A difference between those potentials is detected and output as an output signal VOUT.

In the first static inverter, the p-type MOSFET QP1 operating in the saturated mode (region) possesses a load characteristic curve (a1) and the n-type MOSFET QN1 possesses a drive characteristic curve (b1) as shown in FIG. 7. These curves (a1) and (b1) intersect at a point V1=A1. On the other hand, the p-type MOSFET QP2 of the second static inverter has a gate voltage V1 equal to that of the p-type MOSFET QP1 of the first inverter and has, therefore, a load characteristic curve (c1). With VREF=VBIT, the drive characteristic curve of the n-type MOSFET QN2 of the second static inverter becomes equal to b1. Both the characteristic curves intersect at apoint of VOUT=A1. The drive characteristic of the n-type MOSFET QN2 of the second static inverter, since the curves b1 and c1 intersect in a saturated region, changes to the curves d1 and e1 with a small change in the bit-line potential. Therefore, the intersection of the curve b1 with the load characteristic curve c1 considerably shifts from the VOUT=B1 to a point of VOUT=C1. Thus, a small voltage signal can be sensed and amplified faster at high sensitivity as the characteristic I of FIG. 7.

Referring to FIG. 1, the operation of the amplifier circuit used in a multivalued information storing memory will be described below.

In an initial state of the sense-amplifier circuit, bit-lines (VBIT) and reference-lines (VREF) are usually pre-charged to set at an initial potential V0 (FIG. 2) before reading-out operation. A memory cell is then discharged, whereby the bit-line potential (VBIT) becomes to be one of the bit-line potentials (VTH1, VTH2, VTH3, VTH4) depending on the threshold of the memory cell. On the other hand, the reference line potential takes an intermediate potential value (VREF1, VREF2, VREF3) of the respective bit-lines. For example, when a bit-line potential VBIT is equal to VTH2 according to the threshold of the memory cell to be readout, VBIT at the sub sense-amplifier SL1 becomes higher than VREF1, VBIT at the sub sense-amplifier SL2 becomes lower than VREF2 and VBIT at the sub sense-amplifier SL3 becomes lower than VREF3. At this time, the sub sense-amplifiers SL1, SL2 and SL3 have output signals SA1=0, SA2=1 and SA3=1 respectively and an output information (D1, D2)=(0, 1) is obtained through a circuit shown in FIG. 3. Similarly, an output information as shown in FIG. 4 can be obtained when bit-line potentials are of VTH1, VTH3 and VTH4.

In the current-mirror-type sense-amplifier, the transition of its output SA becomes slower with a smaller difference between a bit-line potential and a reference potential. Accordingly, each sub sense-amplifier having a small difference ($\Delta V=|VBIT-VREF|$) between a bit-line potential and a reference potential may have a considerable delay time of transition, by which the delay time of the sense amplifier circuit is defined. Consequently, the sense amplifier circuit of FIG. 1 causes the memory to have an access time that is defined by SL1 with a least difference value ($\Delta V$) at the bit-line potential being equal to VTH1, by SL1 or SL2 at VTH2, by SL2 or SL3 and by SL3 at VTH4.

The sense-amplifier circuit used for a multivalued information storing memory is composed of a plurality of sub sense-amplifiers corresponding to respective reference potentials. If the sub sense-amplifiers are the same in construction, they have different sensitivity (gain) depending on the input potential signals irrespective of the same difference ($\Delta V$). The gain characteristics of the sub sense-amplifiers are shown in FIGS. 7, 8 and 9.

In other words, the sense amplifier circuit may have an operating characteristic II shown in FIG. 8 at a higher reference potential, in which load and drive characteristic curves intersect at a point A outside the saturated region of the drive characteristic. Therefore, a change in bit-line potential VBIT causes the second static inverter to change the drive characteristic of its MOSFET QN2 into curves d2 and e2, resulting in that the intersection between the drive characteristic e2 and the load characteristic c2 is shifted from the point VOUT=B2 to the point VOUT=C2. Thus, the same change in the bit-line potential may cause |B2−C2|<|B1−C1| to reduce the gain (sensitivity) of the amplifier circuit. At the same time, a drain current increases because of the condition Id2>Id1.

On the other hand, the sense amplifier circuit may have an operating characteristic III (FIG. 9) at the lower reference potential, in which the load and drive characteristic curves intersect at a point A3 outside the saturated region of the drive characteristic. Therefore, a change in bit-line potential VBIT causes |B3−C3|<|B1−C1| and reduces the gain (sensitivity) of the amplifier circuit. In this case, a drain current is reduced because of Id3<Id1, resulting in slowing the response of the output of the sub sense-amplifiers and also resulting in increasing the delay time of the output D1, D2.

In order to reduce the access time to the multivalued information storing memory, respective sub sense-amplifiers must operate according to the operating characteristic I or the like as shown in FIG. 7. This can be realized by decreasing the difference between the reference potentials of the sub sense-amplifiers. However, a small difference between the reference potentials makes it impossible to provide a large difference between the reference potential and the bit-line potential for each sub-sense-amplifier. This results in an unwanted decrease in the sensitivity of the sense amplifier circuit.

The sense amplifier circuit for the multivalued information storing memory, which is composed of plural sub-sense-amplifiers, requires different periods for obtaining comparison results by the respective sub-sense-amplifiers and, therefore, it can determine the final result at the time when output of the latest sub sense-amplifier can be obtained. This means that all other sub-sense-amplifiers consume excess current until that time.

In a memory constructed as shown in FIG. 10, the potentials VBIT of bit-lines BL of the memory increase with an increase in the corresponding threshold values for a memory cell MC. In the sense amplifier circuit of FIG. 1, the reference potentials VREF1, VREF2 and VREF3 correspond to threshold values in the ascending order. In this case, the sub sense-amplifiers SL1, SL2 and SL3 have characteristics shown in FIGS. 9, 7 and 8 respectively. The sub sense-amplifier SL1 having the reference potential VREF1 and the characteristics of FIG. 9 is the slowest one that finally determines the access time of the sense-amplifier circuit. Therefore, the sub-sense-amplifiers SL3 and SL2 of the characteristics of FIGS. 8 and 7 have no effect on the time of obtaining the final result when their operations are forcibly delayed by limiting their current values until the slowest sub-sense-amplifier SL1 has an output. Namely, the present invention concerns the reduction of current consumption of a sense-amplifier circuit by limiting current values of faster acting sub-sense-amplifiers so they may have the same delay time that the slowest sub-sense-amplifier has. By doing this, the maximal saving in current consumption of the sense-amplifier circuit with no change in the access time defined by the time of obtaining the final result by the slowest sub sense-amplifier.

The current of each sub-sense-amplifier can be limited, for example, by limiting current to a switching element interposed between the power potential and the ground potential of the sub-sense-amplifier. At this time, it is desirable to control the current to the switching element according to the threshold value of the corresponding memory cell for generating a reference potential so that the dispersion of the threshold may be well followed up. For example, a larger margin can be obtained for dispersion of the manufacturing process by limiting the current of the switching element to larger extent at the higher threshold when a MOSFET having the same threshold as that of the memory cell is used as the element.

SUMMARY OF THE INVENTION

It is an object of the present invention is to provide a sense amplifier circuit for multivalued information storing memories, which circuit has reduced current consumption without increasing the delay time of the circuit.

Another object of the present invention is to provide a sense amplifier circuit comprising plural current-mirror type sub-sense-amplifiers corresponding to plural reference potentials, wherein specified ones or all the current-mirror-type sub-sense-amplifiers are provided with current-limiting means.

Another object of the present invention is to provide a sense amplifier circuit comprising plural current-mirror type sub-sense-amplifiers corresponding to plural reference potentials, wherein specified sub-sense-amplifiers are provided with current limiting means.

Another object of the present invention is to provide a sense amplifier circuit comprising plural current-mirror type sub-sense-amplifiers corresponding to plural reference potentials, wherein each of the current limiting means comprises a switching element interposed in some place of a passage between the power-source potential and the grounding potential of a designated sub-sense-amplifier and a potential applying means for applying a potential to a control electrode of the switching element.

Another object of the present invention is to provide a sense amplifier circuit comprising plural current-mirror type sub-sense-amplifiers corresponding to plural reference potentials, wherein each of the current limiting means comprises a switching element for controlling active and inactive states of a designated sub-sense-amplifier and a potential applying means for selectively applying a specified current-limiting potential or off-potential to a control electrode of the switching element.

Another object of the present invention is to provide a sense amplifier circuit comprising plural current-mirror type sub-sense-amplifiers corresponding to plural reference potentials, wherein the current-limiting potentials are predetermined for respective sub-sense-amplifiers according to the corresponding reference potentials.

Another object of the present invention is to provide a sense amplifier circuit comprising plural current-mirror type sub-sense-amplifiers corresponding to plural reference potentials, wherein the current-limiting potentials are of the same value commonly applied to all the sub-sense-amplifiers provided with the current limiting means.

DESCRIPTION OF THE PREFERRED EMBODIMENTS

Figure 11:
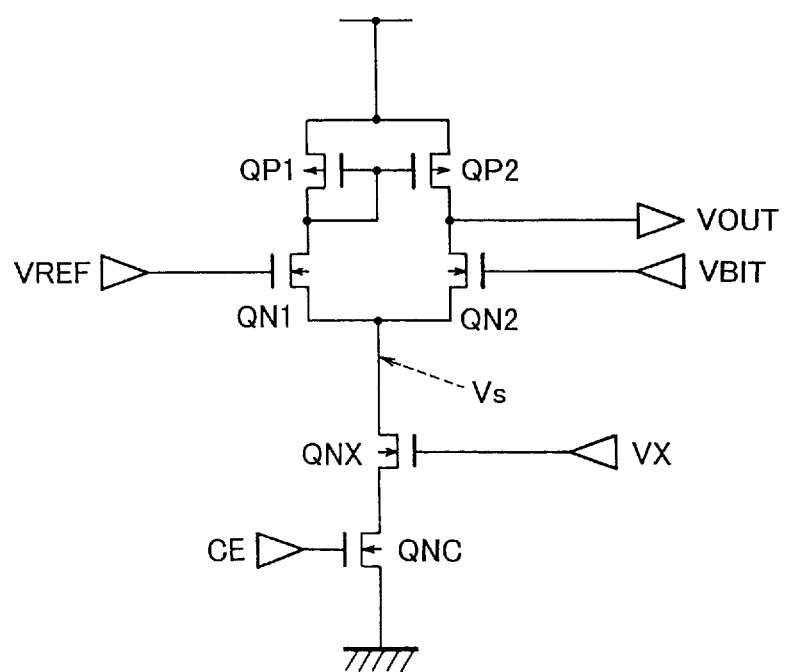
FIG. 11 is a circuit diagram showing a sense-amplifier circuit with current-limiting means, which is the first embodiment of the present invention.

FIG. 11 is a circuit diagram of a sub-sense-amplifier provided with current-limiting means, which composes a sense amplifier circuit according to the present invention.

The sub-sense-amplifier circuit has a load transistor composed of p-type metal-oxide-silicon field-effect transistors (MOSFET) QP1 and QP2. A reference potential VREF is input to the gate of n-type MOSFET QN1 and a bit-line potential is input to the gate of n-type MOSFET QN2. The drain of the transistor QN1 is connected to the drain of the transistor QP1 composing a current mirror while the drain of the transistor QN2 is connected to the drain of the transistor QP2 composing the current mirror. The sources of the transistors QN1 and QN2 are connected to the drain of an n-type MOSFET QNX composing a switching element. The gate of the transistor QNX is given a control voltage (a specified current-limiting potential) VX. The source-to-drain path of an n-type MOSFET QNC composing a drive transistor is connected to a source-to-ground path of the MOSFET QNX. The MOSFET QNC is switched on and off by a sense-amplifier activating signal CE.

Figure 12:
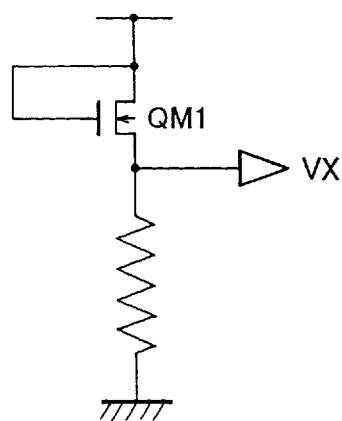
FIG. 12 shows an exemplified construction of a control-voltage generating circuit for outputting a control voltage to a switching element in the sense amplifier circuit according to the first embodiment of FIG. 11.

FIG. 12 shows an exemplified construction of a circuit for generating the control voltage VX that is defined by subtracting a power voltage Vcc from a threshold voltage Vt of the n-type MOSFET QM1. The gate of the switching element QNX is supplied with a specified current-limiting potential dropped from the power potential Vcc so that the drive current of a sub-sense-amplifier is limited to save the power consumption.

The threshold value of the n-type MOSFET QM1 composing the control voltage generating circuit is set simultaneously with setting a threshold value of a memory cell not to complicate the manufacturing process. This makes it possible to set the threshold of the QM1 to match with variation of the threshold of the memory cell. For example, the transistors QM1 is subjected to injection of impurities therein through the same mask as that used for injecting impurities into memory cells of a mask ROM in the same manufacturing process. Another set value of the control voltage can be obtained by using a different mask for injecting a changed amount of impurities into the transistors QM1.

Figure 13:
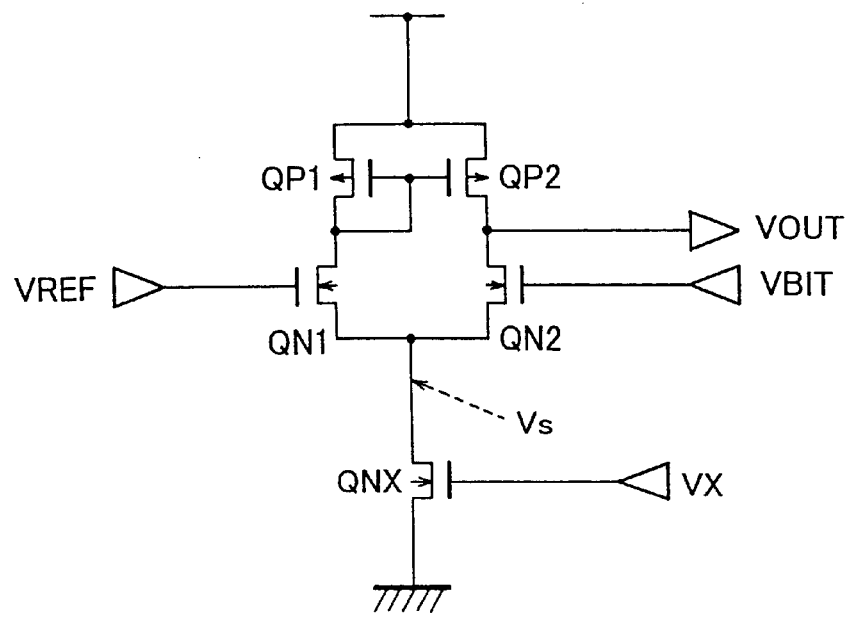
FIG. 13 is a circuit diagram of a first modification of the first embodiment shown in FIG. 11.

The sense-amplifier shown in FIG. 11 includes the drive transistor QNC and the current-limiting switching element QNX separately disposed therein. In the above construction, the driving transistor can be omitted by the provision of a voltage generating circuit for selectively generating a control voltage (a specified current-limiting potential) or a cut-off voltage as the circuit for generating the control voltage VX to the switching element QNX. The sense-amplifier circuit with the control voltage generating circuit according to this aspect is shown in FIGS. 13 and 14.

Figure 14:
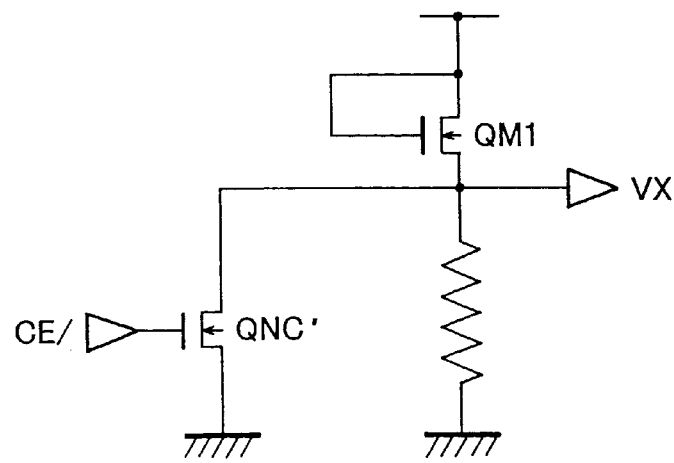
FIG. 14 shows an exemplified construction of a control voltage generating circuit for outputting a control voltage to a switching element in the sense amplifier circuit which is the first modification of the first embodiment shown in FIG. 13.

Referring to FIG. 14, the operation of the control voltage generating circuit is as follows:

As a signal CE with a bar (CE/) remains at a low (L) level while sense-amplifier activating signal CE is at high level (a sense-amplifier is active), an n-type MOSFET QNC' is turned off and a control voltage VX (Vcc−VT) is output. Consequently, the sense amplifier works with a specified limited value of drive current. On the other hand, a signal CE/ turns to a high (H) level when the sense-amplifier activating signal CE is at a low (L) level (the sense-amplifier is inactive), so n-type MOSFET QNC' is turned on and a ground potential is output as the control voltage VX. Consequently, the switching element QNX is turned off to cut off the sense amplifier.

Figure 15:
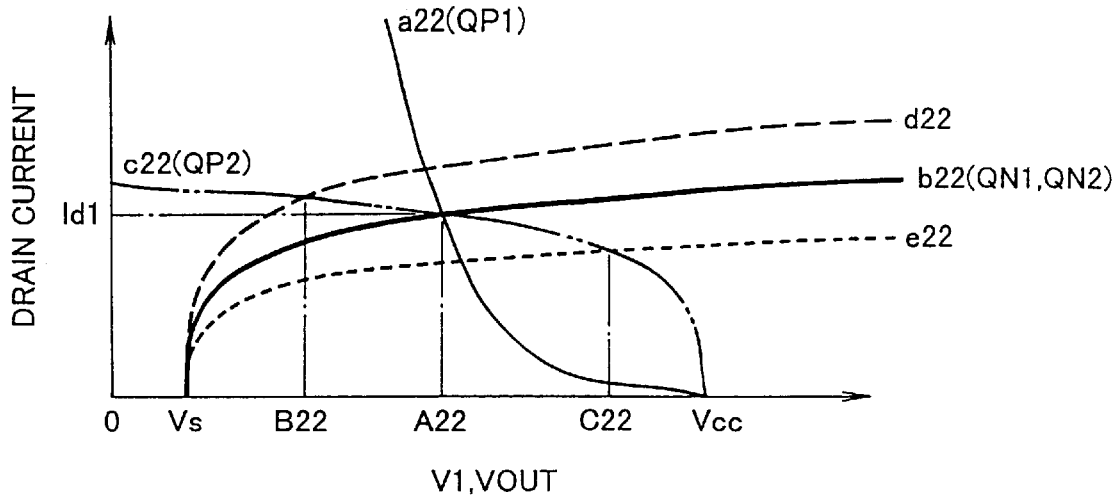
FIG. 15 is a graph showing characteristics of the sense amplifier circuits according to the first embodiment of FIG. 11 and the first modification of FIG. 13.
Figure 16:
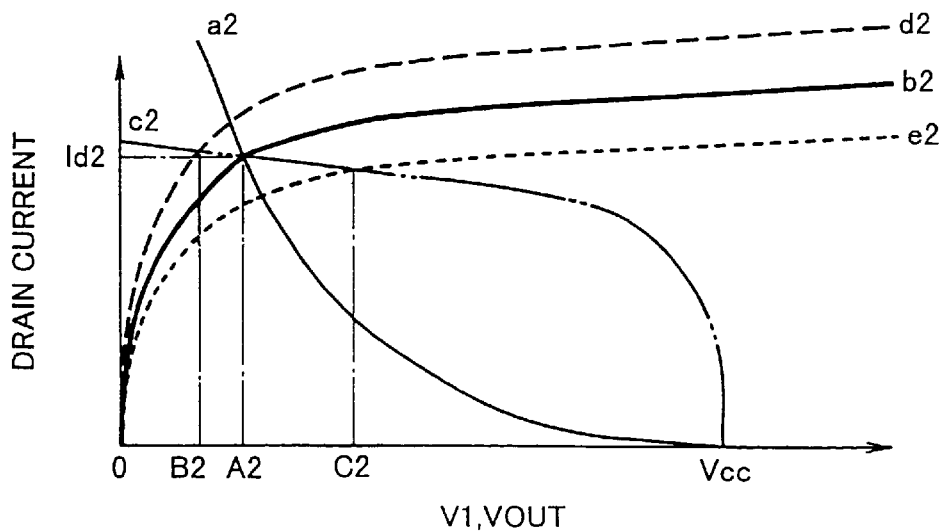
FIG. 16 is a graph showing characteristics of a conventional sense-amplifier with a high reference potential.

The operation of the sense-amplifier with the current-limiting means is as follows:

It is assumed that an n-type MOSFET QNX composing a switching element has a drain potential Vs that is found at a balance point of potentials VREF and VBIT at the specified control voltage VX. The source-gate voltage Vsg of the QN1 and QN2 decrease by the drain potential Vs and, therefore, a sub-sense-amplifier takes the characteristics of FIG. 15. The curves intersect at a point V1=VOUT=A22 in the balanced state (VBIT=VREF). Thus, the sense amplifier may have the sensitivity that the change in the bit-line potential VBIT causes an output VOUT to enlarge from C2-B2 of FIG. 16 to C22-B22 of FIG. 15. At the same time, the current consumption is reduced from Id2 (FIG. 16) to Id1 (FIG. 15). The control voltage VX is desirable to satisfy the condition (the source-gate voltage Vsg−the threshold voltage Vt)<(the source-drain voltage Vsd) so that the switching element QNX can work as a stabilized current source in the saturated region.

Figure 17:
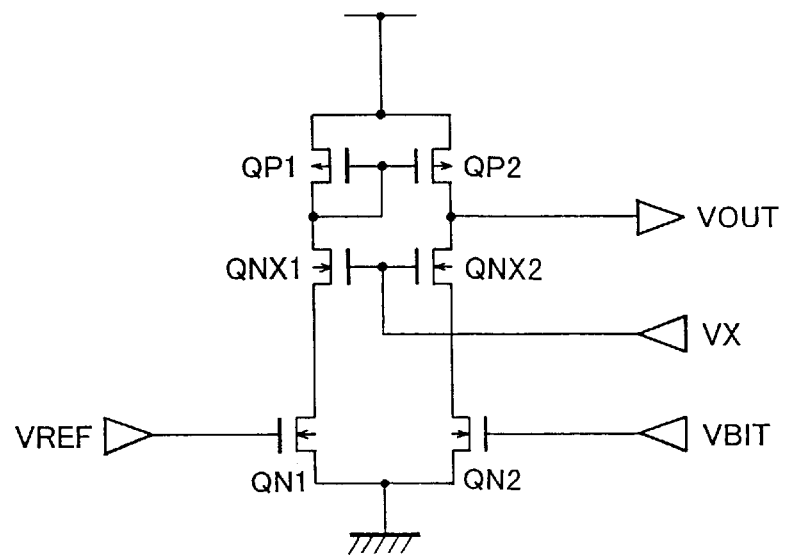
FIG. 17 is a circuit diagram showing a second modification of the first embodiment shown in FIG. 11.

In the sense amplifier without a drive transistor as seen FIG. 17, switching elements QNX (QNX1, QNX2) may be interposed in places (QNX1 and QNX2) between the load circuit (QP1, QP2) and the drive circuit (QN1, QN2). In the sense amplifier circuit with a drive transistor, the switching elements QNX (QNX1, QNX2) can also be disposed between the load circuit (QP1, QP2) and the drive circuit (QN1, QN2) or in other places between the drive transistor and the ground potential.

Figure 5:
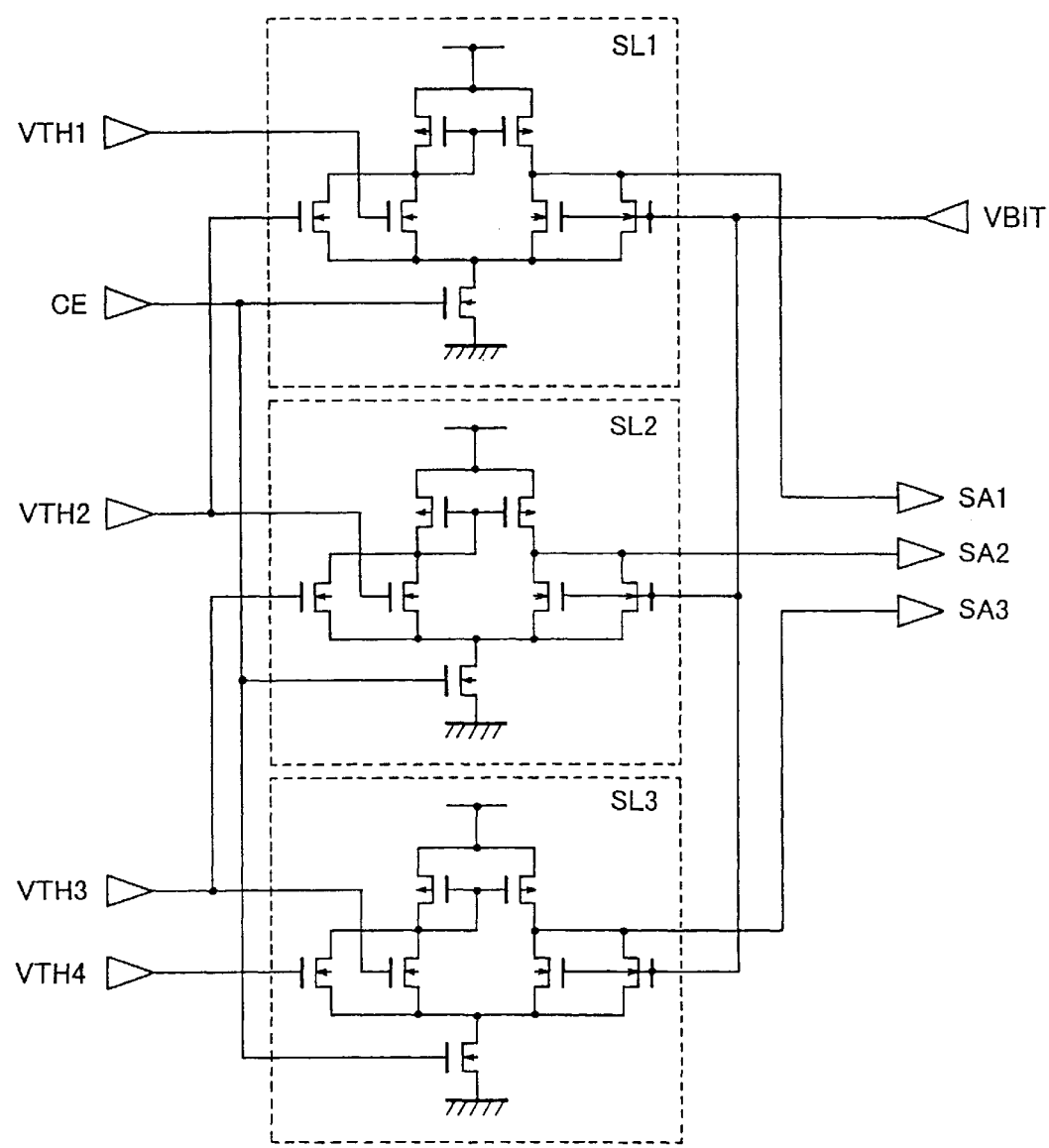
FIG. 5 is a circuit diagram showing a construction of a conventional sense amplifier circuit disclosed in Japanese Laid-open Patent Publication No. 5-217385.
Figure 18:
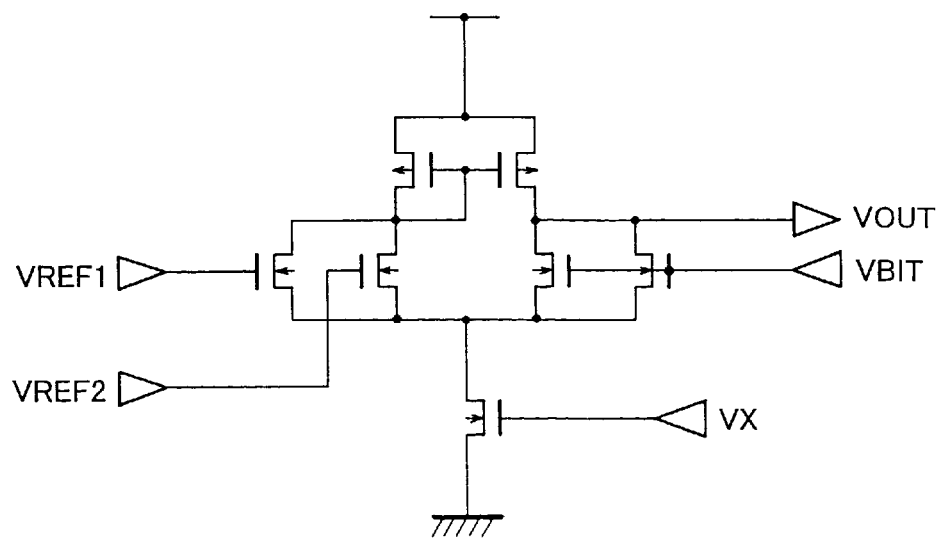
FIG. 18 is a circuit diagram showing a third modification of the first embodiment shown in FIG. 11.

The sense amplifier of FIG. 5 can also be provided with the current-limiting means as shown in FIG. 18. Although the sense amplifier circuit of FIG. 18 does not contain a drive transistor, it may also be provided with a drive transistor and a current-limiting switching element that is disposed separately in a suitable place as described for the ordinary sense-amplifier circuit.

Figure 19:
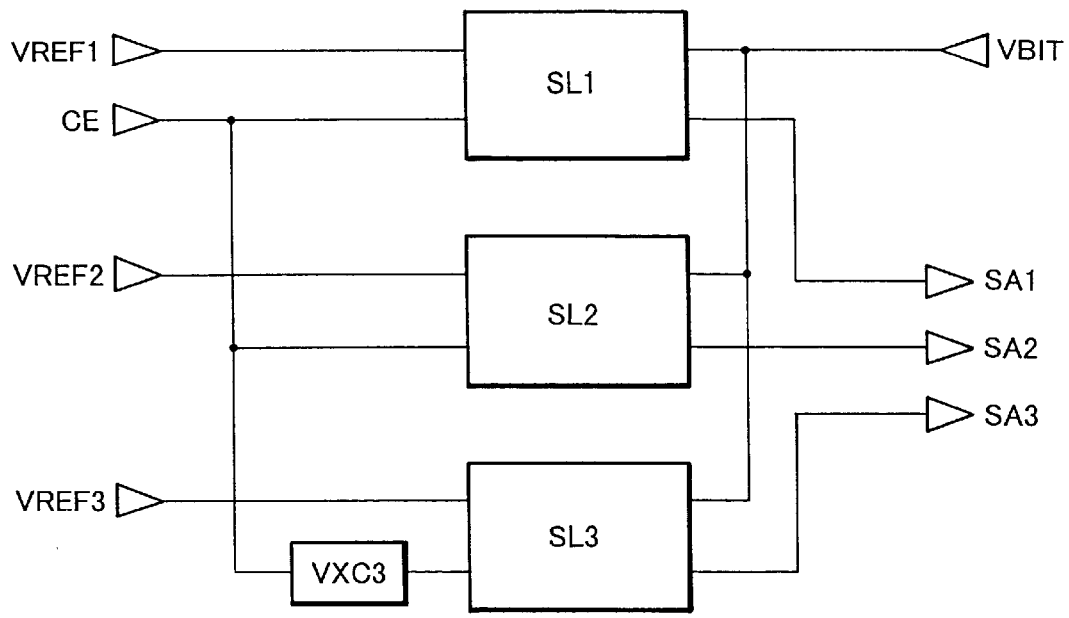
FIG. 19 is a block diagram of a sense amplifier circuit according to the first embodiment of the present invention.

FIG. 19 is a block diagram of a sense amplifier circuit according to the first embodiment of the present invention.

Figure 1:
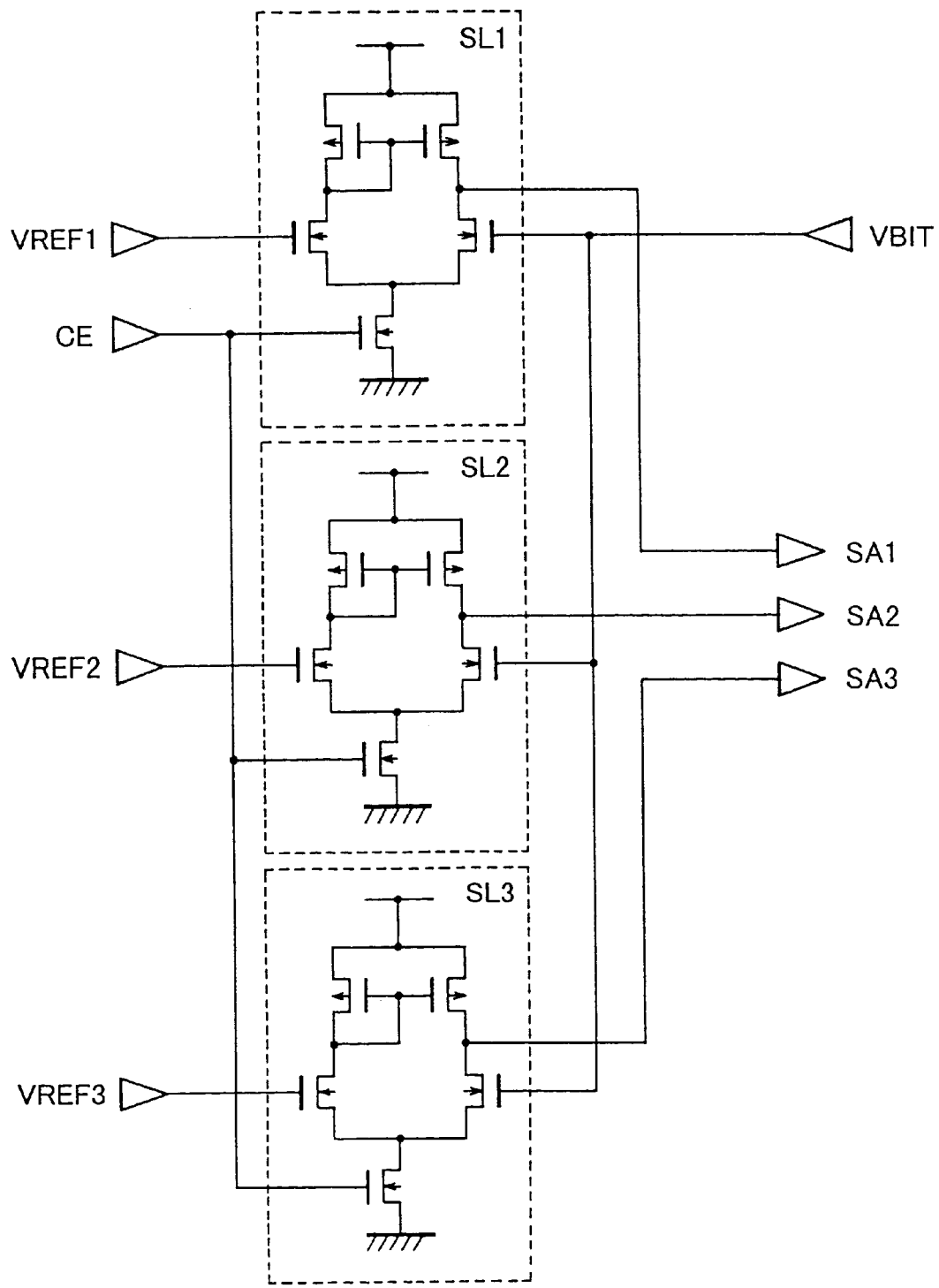
FIG. 1 is a circuit diagram showing a typical construction of a conventional sense amplifier circuit using n-type sub-sense-amplifiers.
Figure 2:
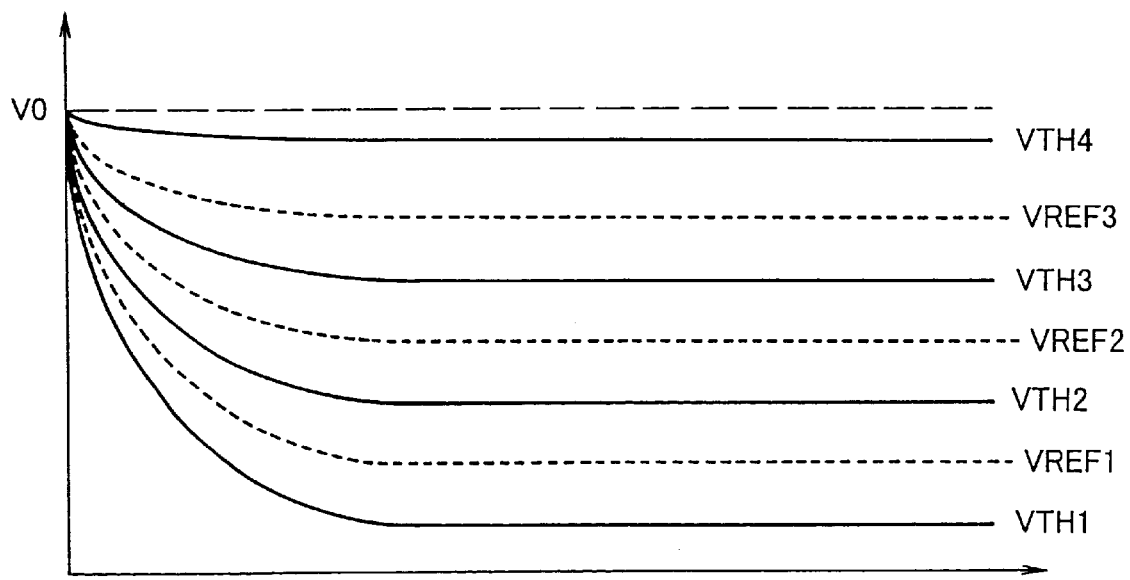
FIG. 2 is a graph for explaining a relationship between bit-line potentials and reference potentials.
Figures 3, 4:
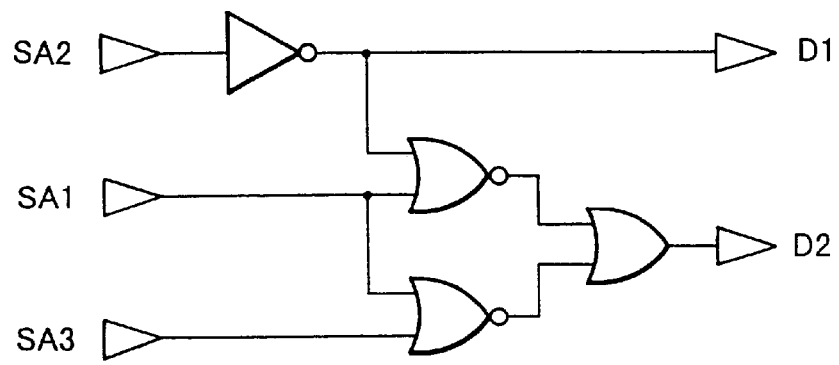
FIG. 3 is a circuit diagram showing an exemplified construction of an electric circuit for decoding a sense-amplifier output signal.
FIG. 4 is a table showing a relationship between bit-line potentials VBIT, sense-amplifier output signals SA and output information D.
Figure 6:
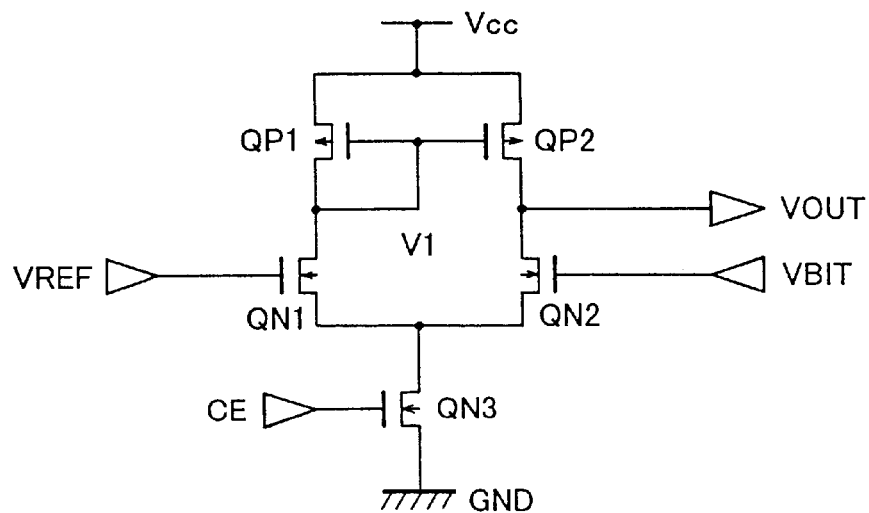
FIG. 6 is a circuit diagram showing an exemplified construction of an n-type sense amplifier.
Figure 7:
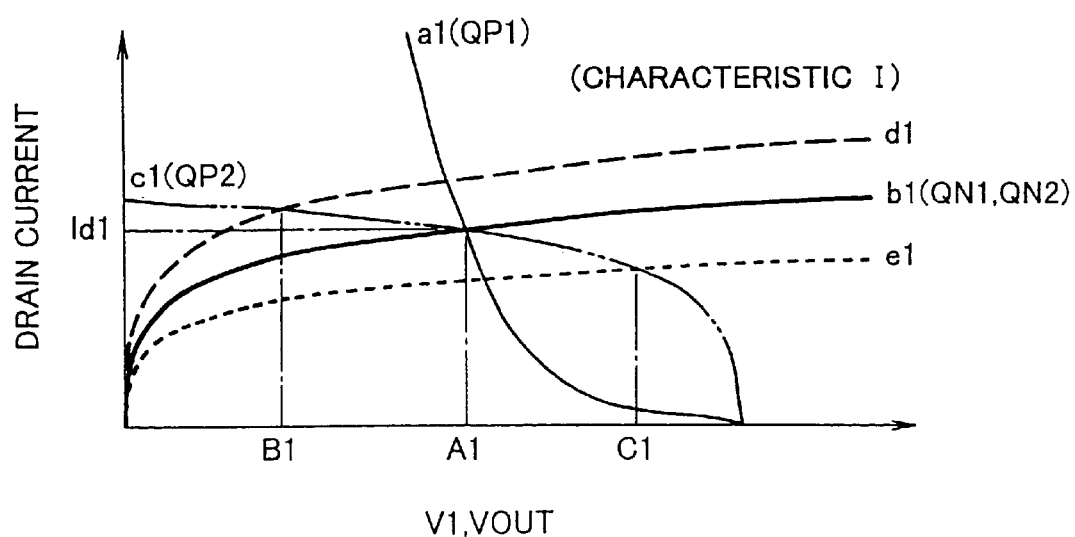
FIG. 7 shows characteristics of an n-type sense amplifier having a medium-level reference potential.
Figure 8:
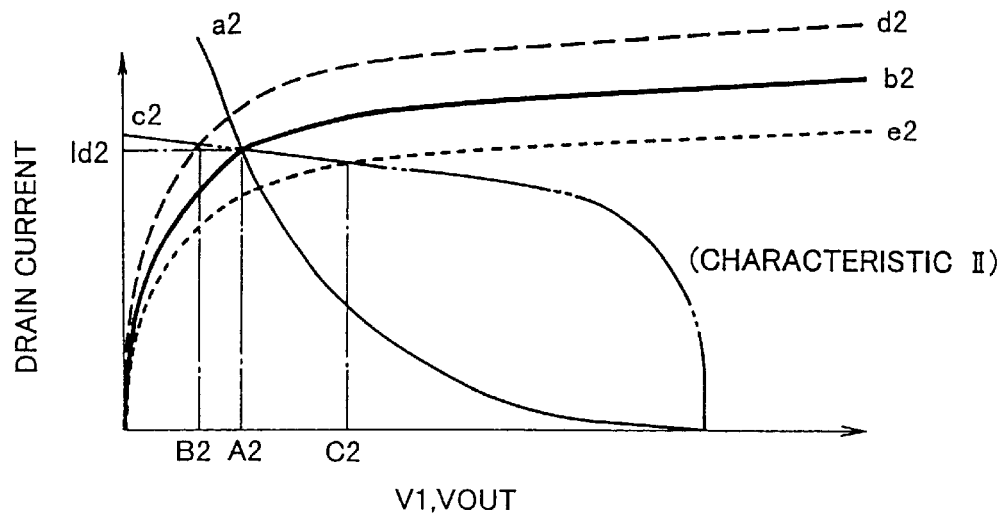
FIG. 8 shows characteristics of an n-type sense amplifier having a high-level reference potential.
Figure 9:
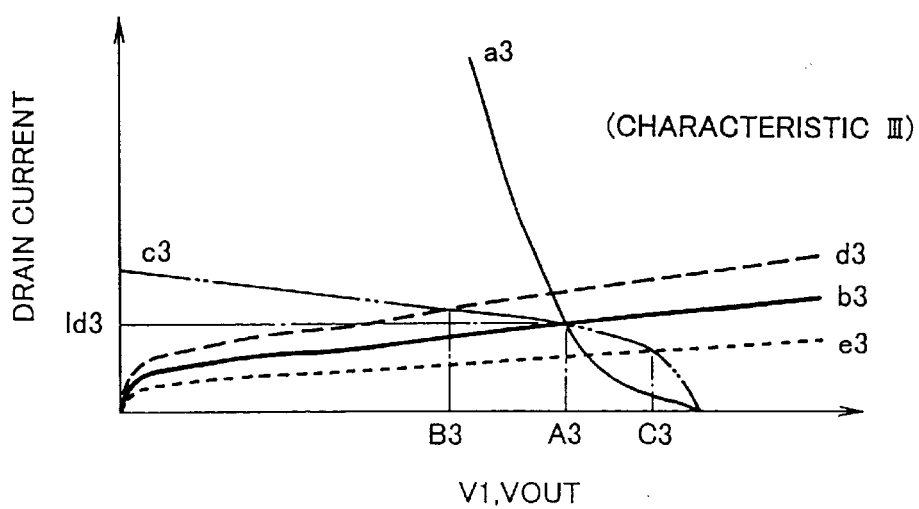
FIG. 9 shows characteristics of an n-type sense amplifier having a low-level reference potential.
Figure 10:
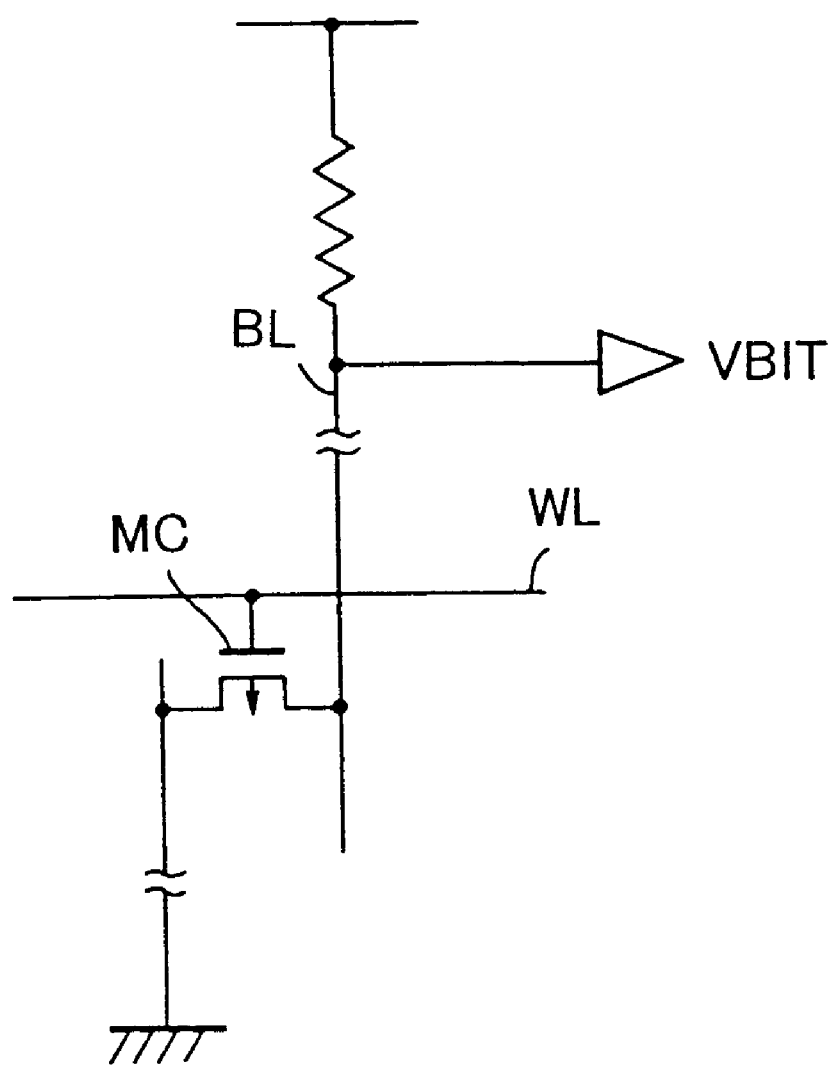
FIG. 10 is a circuit diagram showing an exemplified construction of a memory.

This sense amplifier circuit is used for a four-valued information storing memory and featured in that only a sub-sense-amplifier SL3 with a highest reference potential is provided with a current-limiting means as shown in FIGS. 1 and 13 and other sub-sense-amplifiers SL2 and SL1 are ordinary sense-amplifiers as shown for example in FIG. 6. a control voltage generating circuit VXC3 generates a control voltage to be applied to a gate of the current-limiting switching element for the sub-sense-amplifier SL3 provided with the current-limiting means. The threshold value of the MOSFET QM1 in the control-voltage generating circuit is set to an optimal potential according to the reference potential VREF, e.g., a value equal to a threshold value of a memory cell for outputting the reference potential VREF3 or a value equal to a threshold value of a memory cell for outputting the bit-potential VTH3.

The above embodiment has a minimally needed additional circuit that assures the minimally increased chip area.

Figure 20:
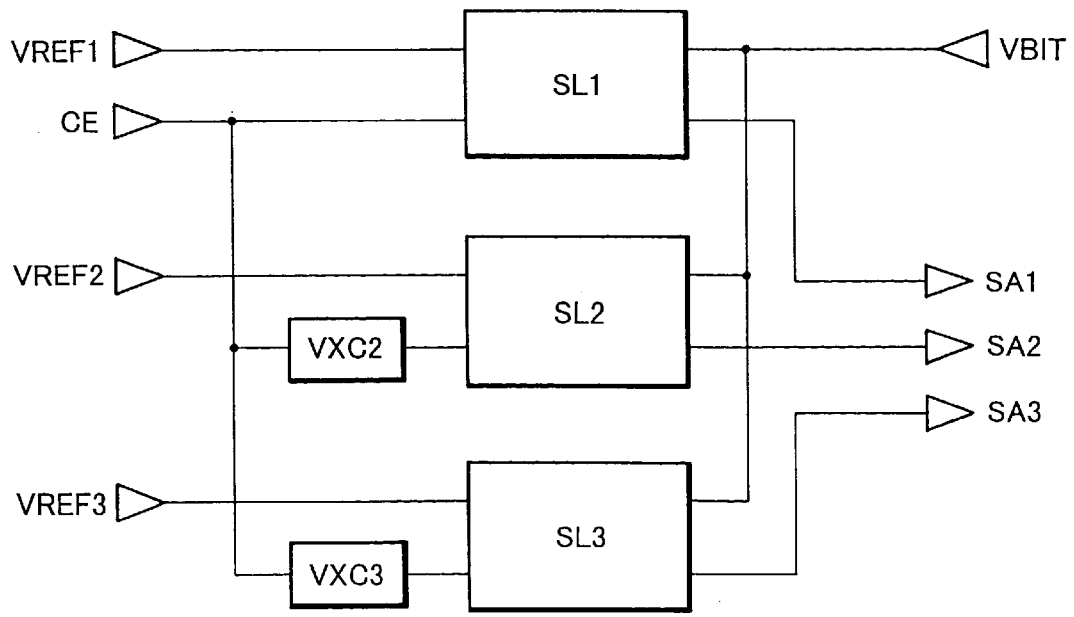
FIG. 20 is a block diagram of a sense amplifier circuit according to a second embodiment of the present invention.

FIG. 20 is a block diagram of a sense amplifier circuit according to the second embodiment of the present invention.

This embodiment is a sense amplifier circuit for a four-valued information storing memory, wherein sub-sense-amplifiers SL2 and SL3 other than SL1 with the lowest reference potential are provided each with a current-limiting means as shown in FIGS. 11 and 13. The sub-sense-amplifier SL1 with the lowest reference potential is of the ordinary construction as shown in FIG. 6. The control voltage generating circuits VXC2 and VXC3 generate control voltages to be applied to gates of the current-limiting switching elements of the sub-sense-amplifier SL2 and SL3 respectively. The threshold voltages of the MOSFET QM1 in the respective control-voltage generating circuits VXC2 and VXC3 are set to optimal values according to the reference potential VREF2 and VREF3 respectively to obtain optimal delay time and sensitivity of respective sense-amplifiers. For example, the threshold of the MOSFET QM1 of the control voltage generating circuit VXC2 is set to a value equal to a threshold value of a memory cell for outputting the reference potential VREF2 or a value equal to a threshold value of a memory cell for outputting the bit-potential VTH2. On the other hand, the threshold of the MOSFET QM1 of the control voltage generating circuit VXC3 is set to a value equal to a threshold value of a memory cell for outputting the reference potential VREF3 or a value equal to a threshold value of a memory cell for outputting the bit-potential VTH3. Thus, the sense amplifier circuit may have a margin for variations of the threshold of the memory cells by matching the thresholds of MOSFET QM1 of the control voltage generating circuits to the thresholds of the corresponding memory cells (i.e., by setting the thresholds of the QM1 and the memory cells in the same production process).

This embodiment may have more additional circuits but may realize further reduction of current consumption.

Figure 21:
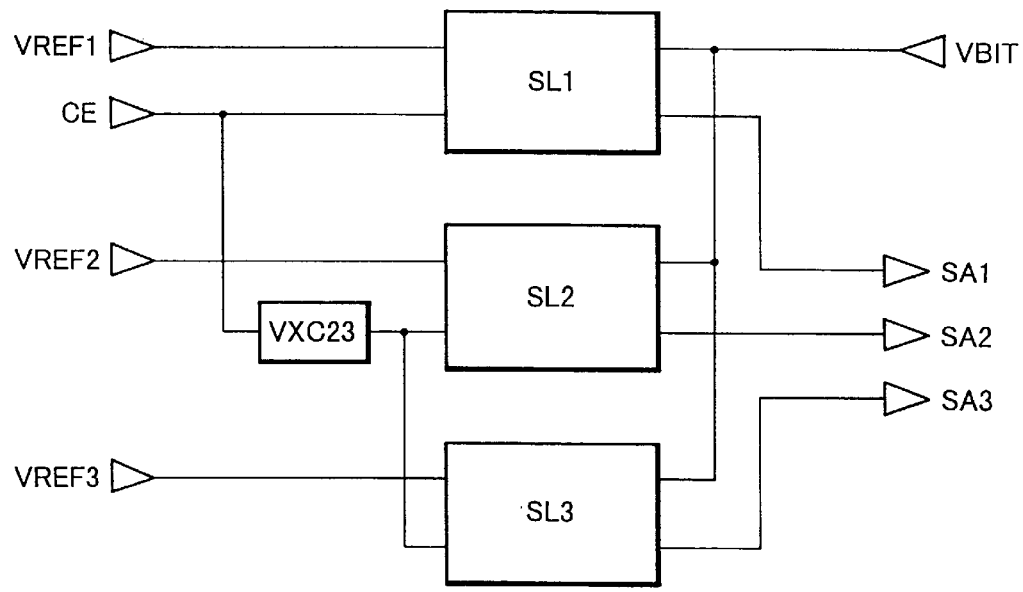
FIG. 21 is a block diagram of a sense amplifier circuit according to a third embodiment of the present invention.

FIG. 21 is a block diagram of a sense amplifier circuit according to the third embodiment of the present invention.

In contrast to the second embodiment in which sub-sense-amplifiers SL2 and SL3 are provided each with a separate control-voltage generating circuits, the third embodiment is featured by the provision of a single control-voltage generating circuit VXC 23 commonly used by the sub-sense-amplifiers SL2 and SL3.

This embodiment is inferior from the second embodiment by the optimization of the parameters but it can realize further reduction in size of the sense-amplifier circuit and further saving in power consumption of the control-voltage generating circuit. The threshold of the MOSFET QM1 in the control-voltage generating circuit is set for example to a value equal to the threshold value of a memory cell for outputting the reference potential VREF2 or a value equal to the threshold value of a memory cell for outputting the bit-potential VTH2.

Figure 22:
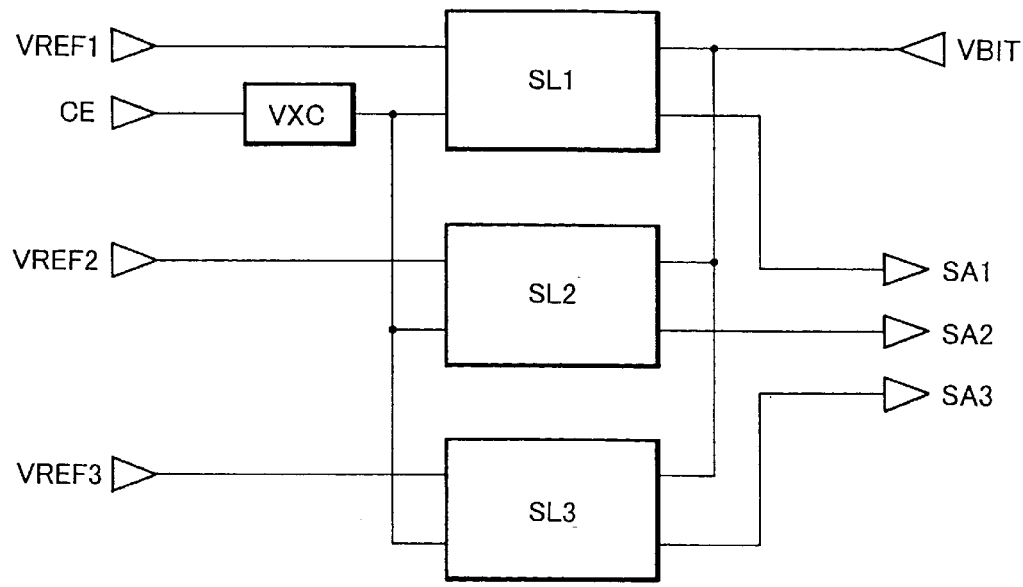
FIG. 22 is a block diagram of a sense amplifier circuit according to a fourth embodiment of the present invention.

FIG. 22 is a block diagram of a sense amplifier circuit according to the fourth embodiment of the present invention.

This embodiment is a sense amplifier circuit for a four-valued information storing memory, wherein all sub-sense-amplifiers SL1, SL2 and SL3 are provided each with a current-limiting means as shown in FIGS. 11 and 13. A control-voltage generating circuit VXC outputs a common control voltage to three sub-sense-amplifiers SL1, SL2 and SL3. In this embodiment, the common control voltage is set to a value at which the current value Id3 of the sub-sense-amplifier SL1. having the lowest reference potential is not limited. This may avoid the increase of delay time of the sub-sense-amplifier SL1. The threshold voltage of the MOSFET QM1 in the control-voltage generating circuit VXC is set, for example, to a value equal to a threshold value of a memory cell for outputting the reference potential VREF1 or a value equal to a threshold value of a memory cell for outputting the bit-potential VTH1.

This embodiment allows further reduction of the power consumption.

This embodiment may be modified in such a way that the sub-sense-amplifiers are provided each with a separate control-voltage generating circuit. Such modification can optimization of the delay time and the sensitivity of respective sub-sense-amplifiers. It also has the advantage of easily attaining matched characteristics of the respective sub-sense-amplifiers with the control-voltage generating circuits since all the sub-sense-amplifiers have the same layout patterns.

On the other hand, the sense-amplifier circuit of FIG. 22 uses the single control-voltage generating circuit commonly used for all sub-sense-amplifiers. It is not so advantageous but has a reduced circuit size and a saved power consumption of the control-voltage generating circuit.

Heretofore have been described the sub-sense-amplifiers (of the first exemplified construction) provided with current-limiting means and the sense-amplifier circuits composed of the sub-sense-amplifiers according to the preferred embodiment of the present invention.

Next, the second exemplified construction of sub-sense-amplifiers provided with current-limiting means and a sense-amplifier circuit composed of the sub-sense-amplifiers according to the preferred embodiment of the present invention will be described below.

Figure 23:
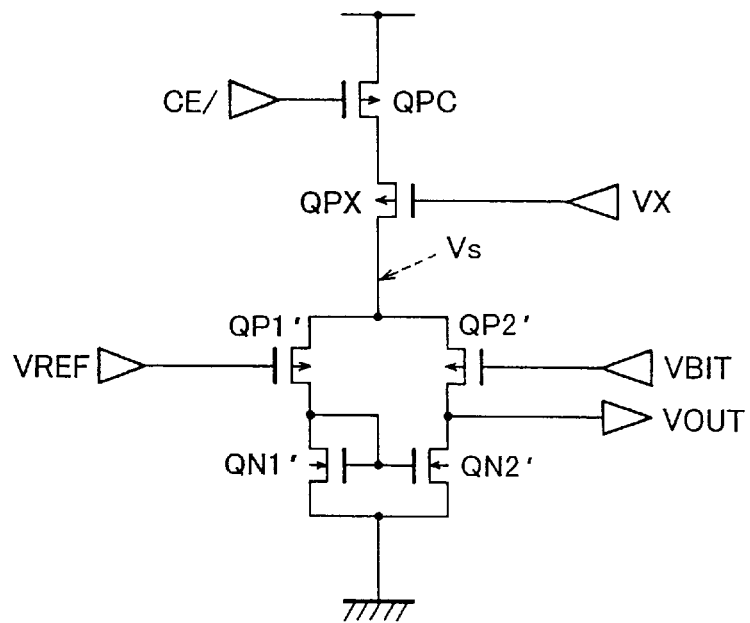
FIG. 23 is a circuit diagram showing a second exemplified construction of a sense amplifier circuit provided with current-limiting means according to the present invention.

FIG. 23 is a circuit diagram showing the second construction of sub-sense-amplifier provided with current-limiting means, which compose a sense amplifier circuit embodying the present invention.

The second construction of a sub-sense-amplifier differs from the first construction of a sub-sense-amplifier in that transistors of the sub-sense-amplifier are reverse in their polarity to the corresponding transistors of the sub-sense-amplifier of the first construction. Therefore, the sub-sense-amplifiers with lower reference voltages must be more restricted by current value in the sense amplifier circuit.

Two load transistors of the sub-sense-amplifier are n-type MOSFET QN1' and QN2'. A reference potential VREF is input to the gate of a p-type MOSFET QP1' and a bit-line potential VBIT is input to the gate of a p-type MOSFET QP2'. The drain of the MOSFET QP1' is connected to the drain of the MOSFET QN2' composing a current-mirror. The sources of the MOSFETs QP1' and QP2' are connected to the drain of a p-type MOSFET QPX composing a current-limiting switching element. The gate of the MOSFET QPX is supplied with a control voltage (i.e., a specified current-limiting potential) VX. The source-to-drain path of a p-type MOSFET QPC composing a drive transistor is connected to between the power supply potential and the source of the MOSFET QPX. The MOSFET QPC is turned on and off by a sense-amplifier activating signal CE/.

Figure 24:
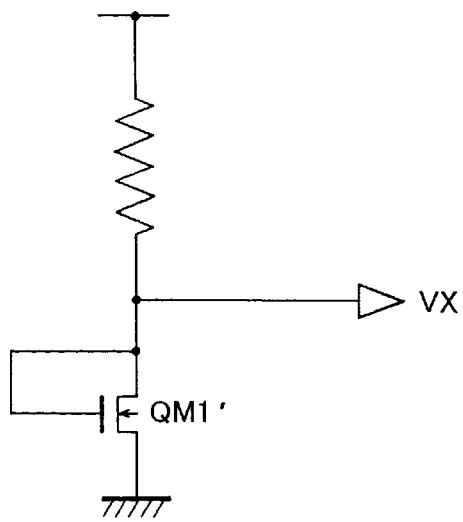
FIG. 24 shows an exemplified construction of a control voltage generating circuit for outputting a control voltage to a switching element in the sense amplifier circuit which is the second construction shown in FIG. 23.

FIG. 24 shows an exemplified construction of a circuit for generating the control voltage VX that is defined by subtracting a power voltage Vcc from a threshold voltage Vt of the n-type MOSFET QM1'. The gate of the switching element QPX is supplied with a specified current-limiting potential raised from the ground potential, whereby a drive current flowing a sub-sense-amplifier is limited to reduce the power current consumption.

The threshold value of the n-type MOSFET QM1' composing the control voltage generating circuit is set simultaneously with setting the threshold value of the corresponding memory cell to avoid the complication of the manufacturing process. This makes it possible to set the threshold of the QM1' to match with variation of the threshold of the memory cell. For example, the transistors QM1' is subjected to injection of impurities therein through the same mask as that used for injecting impurities into memory cells of a mask ROM in the same manufacturing process. Another set value of the control voltage can be obtained by using a different mask for injecting a changed amount of impurities into the transistors QM1'.

Figure 25:
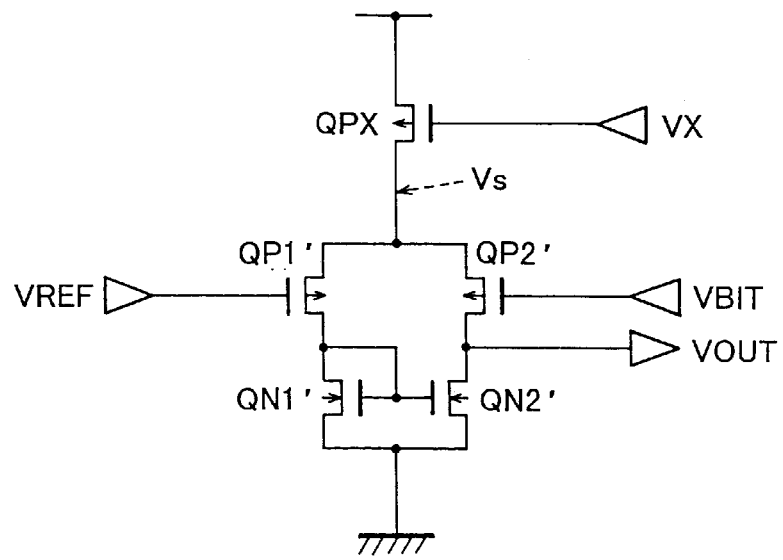
FIG. 25 is a circuit diagram showing a first modification of the second construction shown in FIG. 23.

The sense-amplifier shown in FIG. 23 includes the drive transistor QPC and the current-limitingswitching element QPX separately disposed therein. In the above construction, the driving transistor can be omitted by the provision of a voltage generating circuit for selectively generating a control voltage (a specified current-limiting potential) or a cut-off voltage as the circuit for generating the control voltage VX to the switching element QPX. The sense-amplifier circuit with the control voltage generating circuit according to this aspect is shown in FIGS. 25 and 26.

Figure 26:
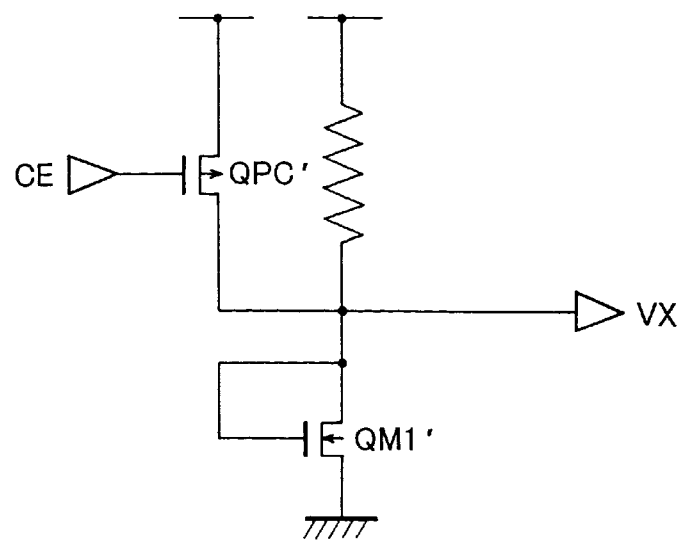
FIG. 26 shows an exemplified construction of a control voltage generating circuit for outputting a control voltage to a switching element in the sense amplifier circuit which is the first modification shown in FIG. 25.

Referring to FIG. 26, the operation of the control voltage generating circuit is described below.

As a signal CE remains at a high (H) level while a sense-amplifier activating signal CE/ is at low (L) level (a sense-amplifier is active), a p-type MOSFET QPC' is turned off and a control voltage VX=Vt is output. Consequently, the sense amplifier operates with a specified limited value of drive current. On the other hand, a signal CE turns to the low (L) level when the sense-amplifier activating signal CE/ is at the high (H) level (the sense-amplifier is inactive), so the p-type MOSFET QPC' is turned on and a ground potential is output as the control voltage VX. Consequently, the switching element QPX is turned off and the sense amplifier is turned off.

Figure 27:
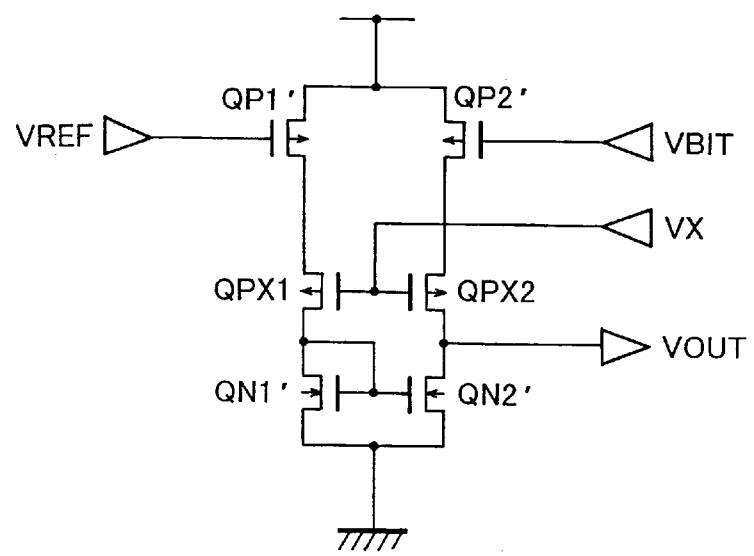
FIG. 27 is a circuit diagram showing a second modification of the second embodiment shown in FIG. 25.

In the sense amplifier without a drive transistor as seen FIG. 27, switching elements QPX may be interposed in places (QPX1, QPX2) between the load circuit (QN1', QN2') and the drive circuit (QP1, QP2'). In the sense amplifier circuit with a drive transistor, the switching elements QPXL and QPX:2 can also be disposed between the load circuit (QN1', QN2') and the drive circuit (QP1', QP2') or in other places between the drive transistor and the ground potential.

Figure 28:
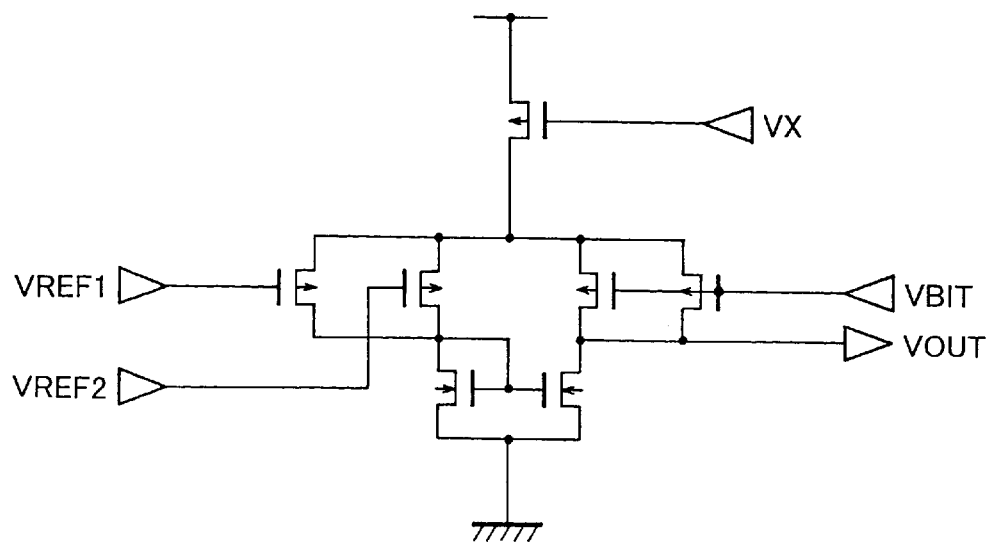
FIG. 28 is a circuit diagram showing a third modification of the second construction shown in FIG. 25.

The sense amplifier constructed as shown in FIG. 5 but with inverted polarity of the transistors can also be provided with the current-limiting means as shown in FIG. 28. Although the sense amplifier circuit of FIG. 28 does not contain a drive transistor, it may also be provided with a drive transistor and a current-limiting switching element that is disposed separately in a suitable place as described for the ordinary sense-amplifier circuit.

The sub-sense-amplifiers having lower reference potential are basically provided with the current-limiting means in case of using the sense amplifier of the second construction, whereas the sub-sense-amplifiers having higher reference potentials are basically provided with current-the limiting means in case of using sense amplifiers of the first construction. Similarly to the sense amplifier circuit of FIG. 22, a sense amplifier circuit can be composed of the sub-sense-amplifiers of the second construction, which are all provided with the current-limiting means.

What is claimed is:

1. A sense amplifier circuit comprising:
   a plurality of current-mirror-type sub-sense-amplifiers corresponding to respective reference potentials, wherein each current-mirror-type sub-sense amplifier of said plurality of current-mirror-type sub-sense-amplifiers comprises a plurality of transistors; and
   a current limiter connected to a drain or a source of at least one of said plurality of transistors of a faster sub-sense-amplifier of said plurality of current-mirror-type sub-sense-amplifiers to control the drain-source current of said faster sub-sense-amplifier, wherein the current limiter reduces the difference in operation delay time between a faster and a slowest sub-sense amplifier.

2. The sense amplifier circuit of claim 1, wherein all sub-sense-amplifiers designated by corresponding reference potentials are provided with a current limiter connected to a drain or a source of at least one of said plurality of transistors of each sub-sense amplifier.

3. The sense amplifier circuit of claim 1 or 2, wherein each of the current limiters comprises a current-limiting switching element interposed in some place of a channel between a power-source potential and a ground potential of a designated sub-sense-amplifier and a potential-applying means for applying a specified current-limiting potential to a control electrode of the switching element.

4. The sense amplifier circuit of claim 1 or 2, wherein each of the current limiters comprises a switching element for controlling active and inactive states of a designated sub-sense-amplifier and a potential applying means for selectively applying a specified current-limiting potential or off-potential to a control electrode of the switching element.

5. The sense amplifier circuit of claim 3 or 4, wherein the specified current-limiting potentials are potentials predetermined for respective sub-sense amplifiers according to the reference potentials.

6. The sense amplifier circuit of claim 3 or 4, wherein the specified current-limiting potentials are of the same value being common to all the sub-sense-amplifiers provided with the current limiter.

* * * * *